(12) United States Patent
Woods et al.

(10) Patent No.: US 9,219,179 B2
(45) Date of Patent: Dec. 22, 2015

(54) MULTILAYER THIN-FILM BACK CONTACT SYSTEM FOR FLEXIBLE PHOTOVOLTAIC DEVICES ON POLYMER SUBSTRATES

(71) Applicant: Ascent Solar Technologies, Inc., Denver, CO (US)

(72) Inventors: Lawrence M. Woods, Littleton, CO (US); Hobart Stevens, Golden, CO (US); Joseph H. Armstrong, Littleton, CO (US)

(73) Assignee: ASCENT SOLAR TECHNOLOGIES, INC., Denver, CO (US)

( * ) Notice: Subject to any disclaimer, the term of this patent is extended or adjusted under 35 U.S.C. 154(b) by 0 days.

(21) Appl. No.: 14/198,209

(22) Filed: Mar. 5, 2014

(65) Prior Publication Data

US 2014/0186993 A1  Jul. 3, 2014

Related U.S. Application Data

(63) Continuation of application No. 13/572,387, filed on Aug. 10, 2012, now abandoned.

(60) Provisional application No. 61/522,209, filed on Aug. 10, 2011.

(51) Int. Cl.
| | | |
|---|---|---|
| H01L 21/00 | (2006.01) | |
| H01L 31/0264 | (2006.01) | |
| H01L 31/0392 | (2006.01) | |
| H01L 31/0224 | (2006.01) | |
| H01L 21/02 | (2006.01) | |

(52) U.S. Cl.
CPC .... *H01L 31/0264* (2013.01); *H01L 31/022425* (2013.01); *H01L 31/03923* (2013.01); *H01L 31/03926* (2013.01); *H01L 21/02485* (2013.01); *Y02E 10/541* (2013.01)

(58) Field of Classification Search
CPC ............. H01L 21/02417; H01L 21/02477; H01L 21/02485
USPC .......................................................... 438/84
See application file for complete search history.

(56) References Cited

U.S. PATENT DOCUMENTS

| | | | |
|---|---|---|---|
| 6,323,417 B1 * | 11/2001 | Gillespie et al. | 136/262 |
| 6,974,976 B2 | 12/2005 | Hollars | |
| 7,271,333 B2 | 9/2007 | Fabick et al. | |
| 8,802,977 B2 * | 8/2014 | Yuan et al. | 438/95 |
| 2005/0074915 A1 | 4/2005 | Tuttle et al. | |
| 2005/0109392 A1 | 5/2005 | Hollars | |
| 2009/0032108 A1 | 2/2009 | Leidholm et al. | |
| 2009/0084427 A1 | 4/2009 | Anderson et al. | |

(Continued)

OTHER PUBLICATIONS

International Search Report and Written Opinion issued in related PCT Patent Application PCT/US2012/50398, dated Nov. 2, 2012, 29 pages.
Blasch P, et al. "optimizaiton of Ti/TIN/Mo Back Contact Properties for Cu (In,Ga) Se Solar Cells on Polyimide Foils," Thin Solid Films, vol. 519, No. 21, Dec. 31, 2010, pp. 7453-7457.

(Continued)

*Primary Examiner* — Chandra Chaudhari
(74) *Attorney, Agent, or Firm* — Lathrop & Gage LLP

(57) ABSTRACT

A polymer substrate and back contact structure for a photovoltaic element, and a photovoltaic element include a CIGS photovoltaic structure, a polymer substrate having a device side at which the photovoltaic element can be located and a back side opposite the device side. A layer of dielectric is formed at the back side of the polymer substrate. A metal structure is formed at the device side of the polymer substrate.

10 Claims, 3 Drawing Sheets

(56) References Cited

U.S. PATENT DOCUMENTS

| | | |
|---|---|---|
| 2009/0288699 A1 | 11/2009 | Auman et al. |
| 2010/0258191 A1 | 10/2010 | Mackie |
| 2011/0030755 A1 | 2/2011 | Fujdala et al. |
| 2011/0217809 A1 | 9/2011 | Li et al. |
| 2011/0318868 A1 | 12/2011 | Schmidt et al. |
| 2012/0006403 A1 | 1/2012 | Rode et al. |
| 2012/0192941 A1 | 8/2012 | Schoop et al. |
| 2013/0061927 A1 | 3/2013 | Woods et al. |
| 2013/0224901 A1 | 8/2013 | Wang |
| 2013/0284251 A1 | 10/2013 | Krasnov et al. |
| 2013/0284252 A1 | 10/2013 | Krasnov |
| 2014/0335651 A1 | 11/2014 | Li et al. |

OTHER PUBLICATIONS

U.S. Appl. No. 13/572,387 Office Action dated Dec. 5, 2013, 10 pages.

PCT Patent Application PCT/US2015/020184 International Search Report and Written Opinion dated Jun. 25, 2015, 13 pages.

U.S. Appl. No. 14/210,209, filed Apr. 28, 2015, 9 pages.

U.S. Appl. No. 14/210,209 Notice of Allowance issued Aug. 4, 2015, 9 pages.

Chinese Patent Application 201228047345.1 Office Action issued Aug. 5, 2015, received Sep. 8, 2015, with Concise Explanation of Relevance, 12 pages.

Korean Patent Application 14/198,209 Notice of Preliminary Rejection, dated Oct. 22, 2015, with Concise Explanation of Relevance, 14 pages.

\* cited by examiner

MULTILAYER THIN-FILM BACK CONTACT SYSTEM FOR FLEXIBLE PHOTOVOLTAIC DEVICES ON POLYMER SUBSTRATES

CROSS-REFERENCE TO RELATED APPLICATIONS

This application is a continuation of U.S. non-provisional application Ser. No. 13/572,387 filed Aug. 10, 2012, which claims the benefit of priority to U.S. Provisional Patent Application No. 61/522,209 filed Aug. 10, 2011. Each of the above-mentioned applications is incorporated herein by reference.

BACKGROUND

1. Technical Field

This disclosure relates to photovoltaic modules and methods of manufacturing photovoltaic modules and, more particularly, to photovoltaic modules and methods of manufacturing photovoltaic modules in which mechanical distortion in the modules is substantially reduced or eliminated.

2. Discussion of the Related Art

One type of flexible photovoltaic (PV) module is formed as a thin-film device on a polymeric substrate. An example of such devices is the Copper-Indium-Gallium-Selenide (CIGS) device. CIGS devices present many challenges in terms of the thin-film deposition processes, device patterning, and final assembly/packaging. Polymer substrates are of great significance since high-temperature variations of the material are adequate to accommodate CIGS processing while the material maintains its dielectric properties, which enables monolithic integration without any additional insulating films.

A fundamental challenge in flexible CIGS devices is in the deposition of a metallic back contact onto the polymer prior to the deposition of the CIGS p-type absorber layer. This back contact makes ohmic contact to the CIGS and allows for current to flow through the device and be collected through interconnects to the leads attached to the electrical load. Thus, this back contact, which is usually a metal, must maintain high electrical conductivity, both before and after device processing. It must also survive the deposition environment for the subsequent thin film deposition steps.

SUMMARY

According to a first aspect, a polymer substrate and back contact structure for a photovoltaic element is provided. The structure includes a polymer substrate having a device side at which the photovoltaic element can be located and a back side opposite the device side. A layer of dielectric is formed at the back side of the polymer substrate. A metal structure is formed at the device side of the polymer substrate.

According to another aspect, a photovoltaic element is provided. The photovoltaic element includes a CIGS photovoltaic structure and a polymer substrate having a device side at which the CIGS photovoltaic structure can be located and a back side opposite the device side. A layer of dielectric is formed at the back side of the polymer substrate. A metal structure is formed at the device side of the polymer substrate between the polymer substrate and the CIGS photovoltaic structure.

BRIEF DESCRIPTION OF THE DRAWINGS

The foregoing and other features and advantages will be apparent from the more particular description of preferred aspects, as illustrated in the accompanying drawings, in which like reference characters refer to the same parts throughout the different views. The drawings are not necessarily to scale. In the drawings, the thickness of layers and regions may be exaggerated for clarity.

DETAILED DESCRIPTION

For CIGS devices, molybdenum (Mo) has been a common choice of material for a back contact, regardless of the substrate. While Mo can be deposited in a straightforward manner using DC sputtering or other thin film deposition methods, the wide range of stress states possible with sputtering can particularly complicate deposition onto flexible substrates, particularly those that do not exhibit significant stiffness, such as polymers. Unlike rigid substrates where the film stresses can readily be borne by the substrate, film stresses can have a significant impact upon the life, surface topology, and physical properties of flexible substrates, particularly substrates made from polymers. This class of substrates, while exhibiting excellent dielectric properties that allow monolithic integration, also typically exhibits high and inconsistent thermal expansion coefficient compared to the metals and semiconductors of the CIGS layer stack. Thus, there exist extrinsic stresses that combine with intrinsic stresses that can warp, wrinkle, distort and otherwise diminish the integrity of these flexible substrates. In addition, the electrical and mechanical properties of a back contact also affect the device performance and adhesion.

Figure 1:
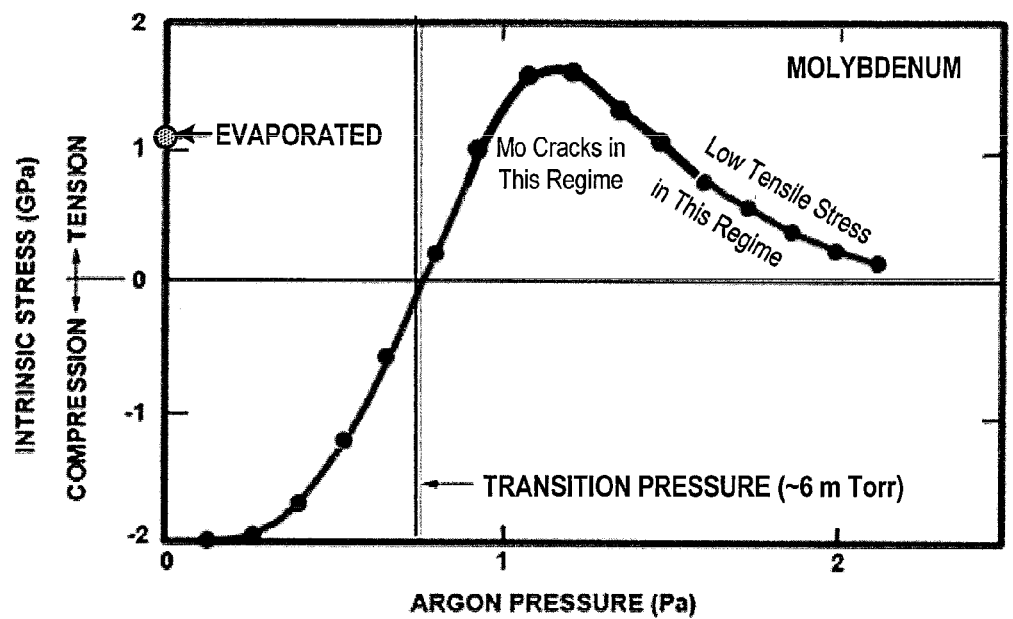
FIG. 1 includes a graph of intrinsic stress in Mo as a function of Ar pressure during a vacuum-based sputtering Mo deposition process.

FIG. 1 contains a graph of intrinsic stress state of sputtered Mo as a function of Argon pressure during a vacuum-based sputtering Mo deposition process. A careful balance of intrinsic and extrinsic stresses in the back contact deposition step is thus desirable to provide a viable flexible photovoltaic device. The method of deposition, deposition pressure, rates, web process gasses, web speed, and number of passes are all variables that are balanced to provide the best back contact for the device.

According to the present disclosure, a multilayer approach using two or more different metals in the back contact is used to replace the prior Mo film deposited onto both sides of a high-temperature polymeric substrate. According to the disclosure, the polymeric substrate can be, for example, polyimide, polybenzobisoxazole (PBO), insulated metal foils, or other such material for flexible, monolithically integrated CIGS modules using a high-temperature CIGS deposition process, such as multi-source evaporation. Unlike prior processes which use Mo films on both sides of the polymer in order to balance the stresses of this process, along with subsequent CIGS, CdS and TCO depositions, according to some exemplary embodiments, a stress-balanced back contact is formed using a dielectric film on the back side of the polymer substrate, a primary high-conductivity but low-modulus and low-cost metallic film layer, for example, aluminum (Al), applied to the front side of the polymer, followed by a thin cap of Mo over the Al film layer. The Mo may be disposed onto the Al with or without added oxygen.

Figure 2:
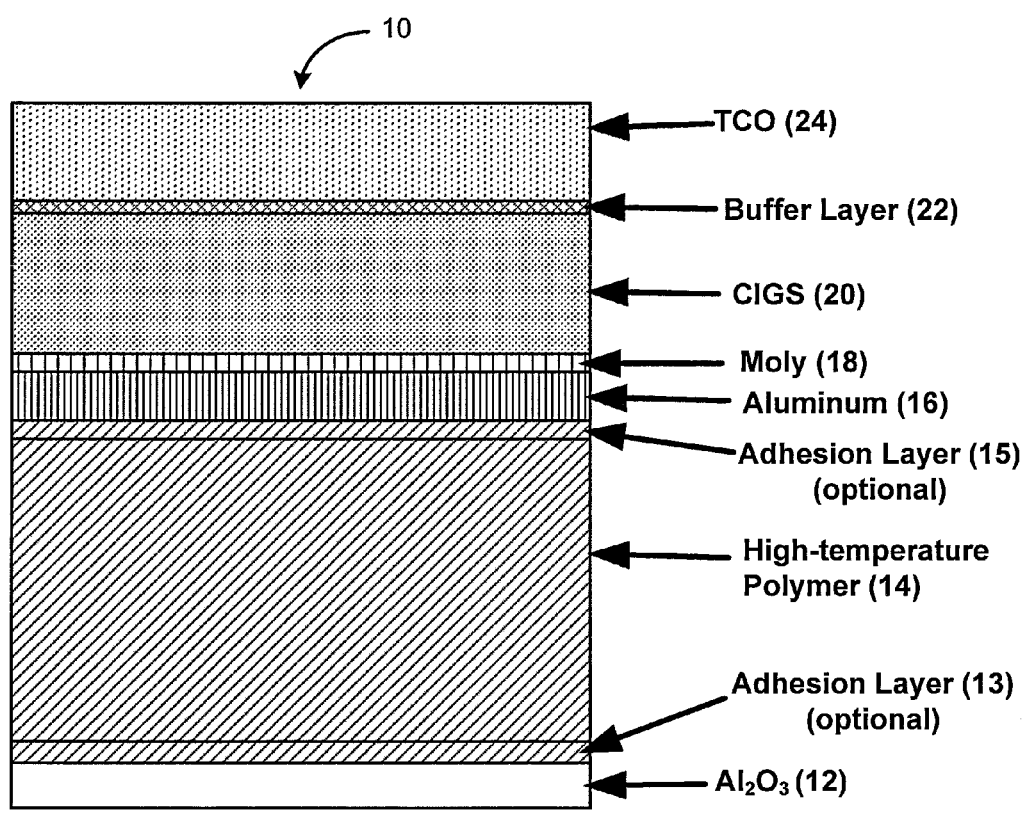
FIG. 2 includes a schematic cross-sectional view of a back contact for a flexible monolithically integrated CIGS photovoltaic device on a polymer utilizing a metallic multilayer as a top contact and an oxide as a back-side coating, according to some exemplary embodiments.

FIG. 2 contains a schematic cross-sectional view of a back contact for a flexible monolithically integrated CIGS photovoltaic device on a polymer utilizing a metallic multilayer as a top contact and an oxide as a back-side coating, according to some exemplary embodiments. Referring to FIG. 2, the polymer substrate 14 may be prepared to receive the disposed materials by plasma cleaning, annealing, or other processes best suited for a given combination of substrate and photovoltaic (PV) device. The plasma treatment involves one or more gases. The amounts and percentage of each gas may vary to optimize the treatment for a particular material being deposited. The power density of the plasma and the duration of treatment may also be varied to optimize the treatment. Annealing or heating the substrate before, during, or after plasma treatment may further optimize the treatment. The device 10 according to some exemplary embodiments includes the dielectric film 12, which can be, for example, an oxide such as $SiO_2$, $Al_2O_3$, a nitride, an oxynitride such as an oxynitride of Al or Si, and which, in this particular exemplary embodiment, is $Al_2O_3$, formed at the back side of the polymer substrate 14. Other dielectric coating possibilities include high-temperature silicone, silicone resins, and other polyimides that may not have the structural properties to function as a stand-alone substrate, but that have high-temperature and high-emissivity properties and that are capable of adding compressive stress to the polymer substrate. An optional adhesion layer 13 may be formed on the back side of the polymer substrate 14 before the dielectric film 12 is formed. The adhesion layer 13 can include at least one of molybdenum, aluminum, chromium, titanium, titanium nitride (TiN), a metal oxide, and a metal nitride. The optional adhesion layer 13 can be made very thin, i.e., thin enough to have very low conductivity and having little to no impact on the back side emissivity. The optional adhesion layer 13 may oxidize some during subsequent oxide deposition of the dielectric film 12, forming, for example, Mo oxide, Cr oxide, Ti oxide, etc. The polymer substrate 14 can be, for example, polyimide, polybenzobisoxazole (PBO), insulated metal foil, or other such material. Another optional adhesion layer 15 can be formed over the polymer substrate 14 to aid in adhesion of the subsequent metallic film layer 16. The adhesion layer 15 can include at least one of molybdenum, aluminum, chromium, titanium, titanium nitride (TiN), a metal oxide, and a metal nitride. The metallic film 16 is formed on the front side of the polymer substrate 14 or formed on the front side of the adhesion layer 15 if it is present. The metallic film 16 can be a high-conductivity but low-modulus and low-cost metallic film made of, for example, aluminum, copper, brass, bronze, or other such material. The thin cap layer 18 of Mo is formed over the metallic film 16. The Mo cap layer 18 may be formed with or without added oxygen. The CIGS layer 20 is formed over the Mo cap layer 18, which enables the proper chemical, mechanical and electrical interface to the CIGS layer 20. A buffer layer 22, formed of, for example, CdS, may be formed over the CIGS layer 20, and a transparent conductive oxide (TCO) layer 24 may be formed over the buffer layer 22.

Figure 3:
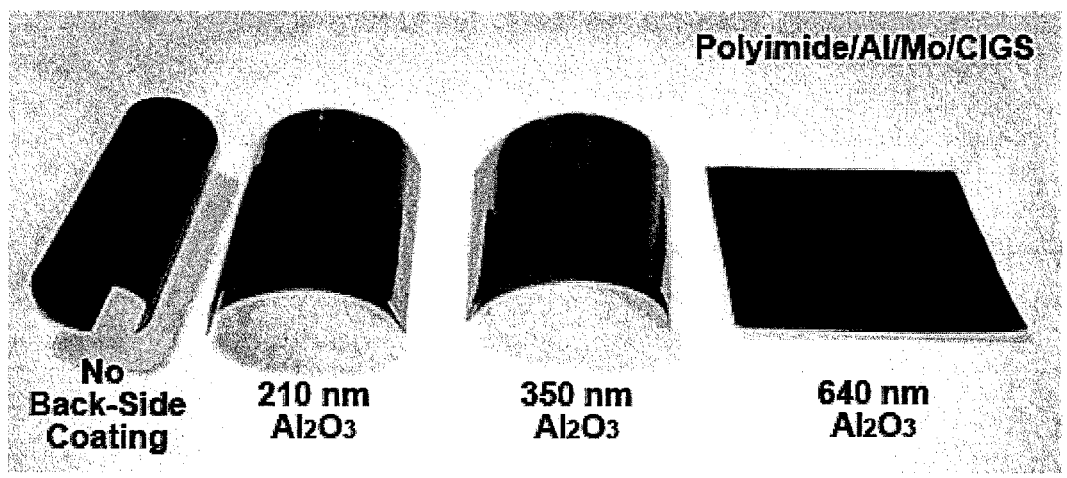
FIG. 3 includes an image of a dielectric-polymer-metal-Mo-CIGS stack structure, according to some exemplary embodiments.

FIG. 3 contains an image of the dielectric-polymer-metal-Mo-CIGS stack structure of the inventive concept, with various (four) thicknesses of the $Al_2O_3$ back side dielectric layer 12. The four exemplary thicknesses of the dielectric layer 12 are 0.0 nm (no back side dielectric layer or coating), 210 nm, 350 nm and 640 nm. As illustrated in FIG. 3, according to the inventive concept, stress balancing is achieved. The combination of back side dielectric film 12, the top-side metallic contacts 16 that serve as the electrical back contact, and subsequent depositions, all balance their respective stresses to achieve a flat material that is better suited for mass production processes.

Referring to FIG. 3, the stack of dielectric-polymer-metal-Mo-CIGS according to the inventive concept has very little compressive stress compared to similar Mo-only back contact films. This is due to the presence of the metal film 16. With the addition of the dielectric film 12 on the back side, the substrate begins to flatten and at a thickness of, for example, 640 nm, all stresses are balanced. According to some exemplary embodiments, depositing a film that can maintain sufficient electrical conductivity while surviving a high-temperature CIGS deposition process in which it is subjected to high temperatures (exceeding 400° C.) in a selenium (Se)-rich environment is a major advancement in the scale-up of flexible monolithically integrated CIGS devices.

Mo presents a challenge in that, not only can the material exhibit dramatically different inherent stresses due to variations in process parameters, but mismatches in the coefficient of thermal expansion (CTE) between Mo and the underlying substrate coupled with high-temperature processing, the stiffness of the substrate, and ultimately, the mechanical properties of the subsequent films, can all lead to large stresses in the resultant multilayer construction. Mo can be deposited in various intrinsic stress states ranging from tensile to compressive in nature, as shown in FIG. 1. With as-deposited Mo films, a transition between tensile and compressive intrinsic stresses in Mo occurs approximately at 6 mTorr with the compressive stress state exhibiting a maxima at approximately 1.2 Pa. However, regardless of the as-deposited stress state of Mo on the polymer, a compressive stress state is the result of Mo on polymer after a high-temperature exposure, e.g., CIGS deposition temperature. These stresses can lead to cracking of the thin films, or even the substrate, particularly if extrinsic stresses are added in the form of bending or otherwise flexing the coated substrate. Stress balancing of the highly compressive Mo back contact, in consideration of subsequent deposition steps, is achieved by depositing a compressive film to the substrate backside. In order to achieve a flat material, the stress state is balanced, and as the top surface has multiple metal, semiconductor, and oxide layers, a corresponding Mo layer applied to the bottom side of the substrate is required to balance the multiple layers on the top side, although in most cases the type of Mo film used on the back side (for stress balancing) is deposited differently and to a different thickness than the Mo film on the front (for back side electrical conductor). Wrinkle reduction is one of the primary reasons that batch processing of panels through the patterning cell is performed to prevent damage to the closely-moving ink head printing operations. However balancing the front and back stresses is much more difficult when the stress levels are high.

Table 1 illustrates the challenge in depositing a metal, particularly Mo, onto a high-temperature polymeric substrate. Both Mo and Al have a much higher modulus by an order of magnitude than the polymer, while the thermal expansion may be a closer match between Al and the polymer than Mo. More importantly, the yield stress of the Al is much lower than Mo, and the stress at 5% elongation of the polymer is closer to Al than Mo. Finally, the ultimate stress of the Mo is nearly twice that of the polymer.

TABLE 1

MECHANICAL PROPERTIES OF ALUMINUM AND MOLYBDENUM COMPARED
TO A TYPICAL HIGH-TEMPERATURE POLYMERIC SUBSTRATE

| Metal | Specific Gravity | Young's Modulus GPa | Poisson's Ratio | Thermal Conductivity (at 0° C.) W/(m ° K) | Linear Expansion Coefficient ×10$^{-6}$ ° C. | Melting Point K | Yield Stress MPa | Ultimate Stress MPa |
|---|---|---|---|---|---|---|---|---|
| Al | 2.7 | 68.95 | 0.33 | 237 | 25 | 933 | 30-140 | 60-140 |
| Mo | 10.2 | 275.80 | 0.32 | 138 | 5 | 2893 | 585-690 | 690-827 |

| Substrate | Specific Gravity | Tensile Modulus GPa | Elongation (%) | Thermal Conductivity (at 0° C.) W/(m ° K) | Linear Expansion Coefficient ×10$^{-6}$/° C. | Max Temp K | Stress at 5% Elongation MPa | Tensile Strength MPa |
|---|---|---|---|---|---|---|---|---|
| UpilexR, | 1.5 | 6.9-9.1 | 42-50 | 0.29 | 12-20 | ~723 | 210-260 | 360-520 |

In accordance with some exemplary embodiments, the overall stress state in the polymer is reduced, and, as a result, a more planar, wrinkle-free substrate is provided. Because Mo is used for a proper interface to CIGS, but is a major reason for the high stresses in the substrate, according to the inventive concept, its use has been minimized to the minimum required to mask the work function of the underlying primary metallic film, as shown in Table 2. In some exemplary embodiments, the primary metallic film of choice is aluminum (Al), although formulations using copper (Cu) and other highly electrically conductive materials, for example, brass or bronze, can be used. The CIGS device relies on the proper work function of its metallic back contact to function properly. While it is possible to use metallic foils (without insulting layers) with subsequent Mo deposition to mask the work function of the metal foil substrate, the inherent stiffness of the non-polymeric substrates enables the ability to apply greater Mo film thicknesses without the Mo stress overwhelming the substrate. With the polymeric process according to embodiments of the inventive concept, and their lower mechanical properties, the desirable masking effect by the Mo of the work function of the underlying primary thin film back contact material (Al, Mo, etc.) is carefully balanced with the high stresses in Mo that can increase with greater Mo thickness. Furthermore, the use of metallic foils without insulating layers precludes the straightforward ability to integrate monolithically the photovoltaic device, and as such, limit device construction to discrete individual cells.

TABLE 2

ELECTRICAL PROPERTIES OF ALUMINUM
AND MOLYBDENUM (AT 20° C.) COMPARED
TO A TYPICAL POLYMERIC SUBSTRATE

| Material | ρ [Ω m] | σ [S/m] | Work Function (eV) |
|---|---|---|---|
| Aluminum | 2.82 × 10$^{-8}$ | 3.5 × 10$^7$ | 4.08 |
| Molybdenum | 5.34 × 10$^{-8}$ | 1.8 × 10$^7$ | 4.60 |
| Upilex PI | ~10$^{+17}$ | ~10$^{-17}$ | N |

The AlMo stack of some exemplary embodiments provides several advantages over conventional single or multi-layer Mo back contacts.

1) The film can be made with the bulk of the stress state dictated by the Al film 16, which is far thicker than the Mo cap 18. Thus, the overall stress state in the front side metallization is reduced.
2) The AlMo stack achieves a far greater electrical in-plane conductivity than the baseline Mo film, exceeding an order of magnitude improvement as is shown in Table 2. This results in the ability to carry greater current than prior devices, and enables greater cell pitch (width) for monolithically integrated modules. Larger cells equates to fewer interconnects, which reduces the interconnect-related losses. Measurements with samples indicate an order of magnitude reduction in sheet resistance, dropping from baseline 2 Ω/square to 0.2 Ω/square. This improvement allows for cell width (pitch) to increase to almost double that demonstrated in baseline conditions, thereby reducing the interconnects by a factor of two as well.
3) While Mo has adequate electrical conductivity for some applications, it constrains the performance of CIGS that possesses high current density (>30 mA/cm$^2$). By using only a thin Mo cap 18, and relying on the conductivity of Al to provide the bulk of the electrical conductivity, the stacked material of the embodiments provides very little sheet resistance. Table 2 also compares the electrical properties of Cu, Al and Mo. Mo has approximately half the electrical conductivity of Al and less than ⅓ the electrical conductivity of Cu. However, as the work function of Al is significantly lower than that of Mo, and that Al would diffuse readily into CIGS, a cap of Mo is retained to shield the low Al work function from CIGS. Likewise, Cu would diffuse into the CIGS during deposition when using Cu, brass or bronze as metal layer 16. Thus, by using a Mo cap, the best electrical properties are retained while providing the proper work function interface to ensure a successful photoelectric effect.
4) As an added benefit to the electrical conductor construction, the thin Mo cap 18 presents a much lower electrical resistance pathway through the P2 laser scribe, e.g., via scribe, into the higher conductivity Al. Thus, while the baseline P2 interconnect resistance under the process of record (POR) is nominally between 500-1000 mΩ-cm, the P2 resistance for this new interconnect drops to 2 mΩ-cm. This alone will account for approximately 5% boost in power output for a given module by reducing module losses.

Because Mo that is sufficiently thick to provide adequate electrical conductivity on polymer contributes adversely to the stress state in the photovoltaic stack, minimizing the Mo content of the device back contact allows for another material, other than Mo, to serve as a back-side film, according to exemplary embodiments. According to the present disclosure, by eliminating dependence upon Mo on the back-side film, and by minimizing it in the back contact, significant advantages over the prior art are realized.

a) Mo serves as an interface to the CIGS, and thus, masks the Al work function in order to allow the device to work optimally. Other metallic elements or alloys can be utilized as desired for new substrates as they become available.
b) The overall reduced stress state in the back contact film provides options for the back side film. In one case, an inexpensive alumina ($Al_2O_3$) film that is a good insulator and provides some level of moisture protection for the polymer can be employed. However, other oxide films can be employed to enhance bonding strength to packaging, and oxynitrides can be substituted for better moisture protection as well.
c) By virtue of reducing the stress state in the films on either side of the polymer substrate, the resultant stress experienced by the polymer is also reduced. Particularly for high-temperature polymers used in roll-to-roll deposition, the reduced stress state will result in reduced wrinkling and waviness of the web, particularly after high-temperature excursions such as those experienced in CIGS deposition.
d) As new flexible, non-conductive substrates are developed, such as Poly(p-phenylene-2,6-benzobisoxazole) (PBO) and are introduced into the flexible CIGS market, experience in reducing the stress imparted by the back contact can result in a construction that may eliminate the need for the back-side film altogether.
e) As achieving the desired Mo stress state is important, deposition rate is limited with standard Mo films, often requiring multiple thinner passes to achieve the desired electrical and stress properties. State-of-the-art films using the process of record (POR) is 390 nm on the front side and 620 nm on the back side of the substrate, for a total of just over a micron (1,010 nm). The nominal Mo thickness with the new construction according to the exemplary embodiments is approximately 100-200 nm, or an 80-90% reduction in the amount of Mo in the device. Using the back contact of the exemplary embodiments significantly reduces the need to deposit in multiple layers, and furthermore, as the film is significantly thinner, at least a 5× throughput increase from the back contact chambers should result, as Al is much easier to deposit at high web rates.
f) Mo is a relatively expensive film in the CIGS device, and is approximately 35 times the cost of Al. As noted above, Mo reduction and substitution of common elements (Al, $Al_2O_3$) reduces the cost of the back contact dramatically. Even in replacing the back-side Mo with $Al_2O_3$ should have a noticeable effect.

As noted above, the Al—Mo back contact has demonstrated dramatically lower sheet resistance and P2 interconnect resistance. Combined, these effects will account for a percentage point of efficiency when module design is optimized to take full advantage of the effects. Even with the same module design, module power should increase by 5% due to the reduced P2 resistance.

According to the exemplary embodiments, elimination of a metal back side film and replacing it with a dielectric layer provides thermal management in the device, in addition to stress management, as described herein in detail. Heating of substrates in a vacuum includes conductive heating (direct contact to a substrate) and/or radiative heating (energy radiating from one source to another). Radiative heating is the most common means of transferring thermal energy to the substrate, but the degree to which energy is conveyed is dependent upon the substrate's absorptivity (ability to absorb energy) and emissivity (ability to radiate heat into the environment). Metals typically have lower emissivity than, for example, oxide films; thus, metal surfaces do not give up their heat as easily as oxides. Thus a polymer coated with metal on both sides can trap the heat within the sandwiched polymer substrate. In a vacuum, a surface coated with a high-emittance coating, such as an oxide or nitride, can provide radiative cooling to that surface and the substrate. A cooler back side coating and substrate helps to keep the substrate from degrading and embrittling during high device-side temperatures, and thus enables higher device-side temperatures that can lead to higher quality solar absorber layers.

Exemplary embodiments have been described herein. For example, exemplary embodiments have been described in terms of specific exemplary polymeric substrates and particular exemplary coatings or layers. It will be understood that the exemplary embodiments relate to stress balancing to provide a back contact in an improved photovoltaic device. Therefore, the present disclosure is applicable to other substrate materials and other back side coatings or layers. In fact, the disclosure may be applicable to structures with alternate substrates and the elimination of back side coating altogether.

Combinations of Features

Various features of the present disclosure have been described above in detail. The disclosure covers any and all combinations of any number of the features described herein, unless the description specifically excludes a combination of features. The following examples illustrate some of the combinations of features contemplated and disclosed herein in accordance with this disclosure.

In any of the embodiments described in detail and/or claimed herein, the photovoltaic element can comprise a CIGS structure.

In any of the embodiments described in detail and/or claimed herein, the dielectric can comprise at least one of $SiO_2$, $Al_2O_3$, and silicone resin.

In any of the embodiments described in detail and/or claimed herein, a thin adhesion layer can be disposed between the layer of dielectric and the back side of the polymer substrate.

In any of the embodiments described in detail and/or claimed herein, the adhesion layer can comprise at least one of Mo, Cr, and Ti.

In any of the embodiments described in detail and/or claimed herein, the metal structure can comprises a first metal layer, the first metal layer comprising at least one of aluminum, brass, bronze and copper.

In any of the embodiments described in detail and/or claimed herein, the metal structure can further comprise a layer of molybdenum formed over the first metal layer.

In any of the embodiments described in detail and/or claimed herein, the metal structure can further comprise a thin adhesion layer disposed between the first metal layer and the device side of the polymer substrate.

In any of the embodiments described in detail and/or claimed herein, the thin adhesion layer can comprise at least one of molybdenum, aluminum, titanium and chromium.

In any of the embodiments described in detail and/or claimed herein, the metal structure can further comprise a thin adhesion layer in contact with the device side of the polymer layer.

In any of the embodiments described in detail and/or claimed herein, the thin adhesion layer can comprise at least one of molybdenum, aluminum, chromium, titanium nitride (TiN), a metal oxide, and a metal nitride.

While the present disclosure makes reference to exemplary embodiments, it will be understood by those of ordinary skill in the art that various changes in form and details may be made therein without departing from the spirit and scope of the present disclosure.

What is claimed is:

1. A method for forming a photovoltaic element, comprising:
   disposing a dielectric layer on a back side of a polymer substrate;
   disposing a metal structure on a device side of the polymer substrate, the device side being opposite of the back side;
   disposing a CIGS photovoltaic structure on the metal structure; and
   before the steps of disposing, annealing the polymer substrate.

2. The method of claim 1, the step of disposing the metal structure comprising:
   disposing a first metal layer on the device side of the polymer substrate; and
   disposing a second metal layer on the first metal layer, the second metal layer having a different composition than the first metal layer.

3. The method of claim 2, the second metal layer comprising molybdenum.

4. The method of claim 3, the first metal layer comprising at least one of aluminum, brass, bronze, and copper.

5. The method of claim 4, further comprising, before the steps of disposing, plasma cleaning the polymer substrate.

6. The method of claim 4, the dielectric layer comprising at least one of $SiO_2$, $Al_2O_3$, and silicone resin.

7. The method of claim 6, further comprising disposing an adhesion layer on the back side of the polymer substrate, before the step of disposing the dielectric layer on the back side of the polymer substrate.

8. The method of claim 7, the adhesion layer comprising at least one of molybdenum, aluminum, chromium, titanium, titanium nitride (TiN), a metal oxide, and a metal nitride.

9. The method of claim 4, further comprising disposing an adhesion layer on the device side of the polymer substrate, before the step of disposing the metal structure on the device side of the polymer substrate.

10. The method of claim 9, the adhesion layer comprising at least one of molybdenum, aluminum, chromium, titanium, titanium nitride (TiN), a metal oxide, and a metal nitride.

* * * * *